United States Patent
Lai et al.

(10) Patent No.: US 7,282,429 B2
(45) Date of Patent: Oct. 16, 2007

(54) METHOD OF MANUFACTURING SCHOTTKY DIODE DEVICE

(75) Inventors: Shih-Chi Lai, Hsinchu (TW); Pei-Feng Sun, Hsinchu (TW); Yi Fu Chung, Hsinchu (TW); Jen Chieh Chang, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 107 days.

(21) Appl. No.: 11/208,374

(22) Filed: Aug. 19, 2005

(65) Prior Publication Data
US 2006/0046368 A1    Mar. 2, 2006

(30) Foreign Application Priority Data
Aug. 26, 2004    (TW)    ............... 93125608 A

(51) Int. Cl.
*H01L 21/28*    (2006.01)
(52) U.S. Cl. ............... 438/570; 257/E21.359; 257/E21.368
(58) Field of Classification Search .......... 438/42, 438/48, 92, 141, 237, FOR. 415, 570–579; 257/267, 280, 281, E27.04, E29.178, E21.047, 257/E21.368, E21.374, E29.338, E21.359
See application file for complete search history.

(56) References Cited

U.S. PATENT DOCUMENTS
7,030,020 B2 *  4/2006 Hsieh ................. 438/694

FOREIGN PATENT DOCUMENTS
JP    08236608 A  *  9/1996

* cited by examiner

*Primary Examiner*—Brook Kebede
(74) *Attorney, Agent, or Firm*—Townsend and Townsend and Crew LLP

(57) ABSTRACT

Embodiments of the invention provide a method of manufacturing a Schottky diode device. In one embodiment, the method includes: (a) providing a substrate; (b) sequentially forming a gate oxide layer and a polysilicon layer on the substrate; (c) partially oxidizing the polysilicon layer to form a poly oxide layer on the polysilicon layer; (d) forming and defining a photoresist layer on the poly oxide layer for exposing parts of the poly oxide layer; (e) etching the poly oxide layer, the polysilicon layer and the gate oxide layer via the photoresist layer for forming a poly oxide structure, a polysilicon structure and a gate oxide structure; and (f) removing the photoresist layer. The present invention introduces a poly oxide layer instead of the CVD oxide for preventing the photoresist lifting issue.

6 Claims, 13 Drawing Sheets

METHOD OF MANUFACTURING SCHOTTKY DIODE DEVICE

CROSS-REFERENCES TO RELATED APPLICATIONS

This application claims priority from R.O.C. Patent Application No. 093125608, filed Aug. 26, 2004, the entire disclosure of which is incorporated herein by reference.

BACKGROUND OF THE INVENTION

The present invention relates to a method of manufacturing an IC device, and more particularly to a method of manufacturing a Schottky diode device.

Schottky diodes are used widely in electronic systems such as amplifiers, receivers, control and guidance systems, and power and signal monitors, and as rectifiers and clamps in RF circuits. Commercial applications include radiation detectors, imaging devices, and wired and wireless communication products. Generally speaking, high frequency Schottky diodes may be GaAs devices. Certainly, RF Schottky diodes can also be silicon devices, which may be integrated in silicon ICs.

FIGS. 1(a)-1(h) illustrate a method of manufacturing a Schottky diode device according to the prior art. As shown in FIG. 1(a), a gate oxide layer 12 and a polysilicon layer 13 are formed on a substrate 11 sequentially. Then, an oxide layer 14 is deposited on the polysilicon layer 13, as shown in FIG. 1(b), by means of a chemical vapor deposition (CVD) process for protecting the MOS region of the device while the follow-up implantation process is performed. A photoresist layer 15 is deposited on the oxide layer 14, and then a part of the photoresist layer 15 is removed via a lithography process thereby obtaining the photoresist layer 15 with the demanded patterns, as shown in FIG. 1(c). Through the patterned photoresist layer 15, a buffered oxide etch (BOE), i.e., an isotropic wet etch, is executed to the oxide layer 14, as shown in FIG. 1(d), and the resulted structure is shown in FIG. 1(e). Then, a dry etch process is performed through the photoresist layer 15 to etch the polysilicon layer 13 and the gate oxide layer 12 for defining the MOS region, as shown in FIG. 1(f). Having developed to this point, the photoresist layer 15 can be removed. After the photoresist layer 15 is removed, an ion implantation process is executed to form the implanted regions in the substrate 11 and the polysilicon layer 13, as shown in FIG. 1(g), using the trapezoid structure of the oxide layer 14 formed after the BOE process as a mask. The problem of electric leakage can be overcome by means of forming the implanted regions in the implantation process using the trapezoid structure of the oxide layer 14 as a mask. Finally, a metal conducting layer 16 is formed on the above structure, as shown in FIG. 1(h), to complete the Schottky diode device.

However, in practice, since a CVD-deposited oxide layer is introduced into the above manufacturing process, the photoresist layer cannot adhere to the oxide layer well. Therefore, the photoresist layer would easily lift and peel from the CVD-deposited oxide layer in the BOE process, thereby influencing the features of the final structure. FIGS. 2(a)-2(h) illustrate another method of manufacturing a Schottky diode device according to the prior art. As shown in FIG. 2(a), a gate oxide layer 12 and a polysilicon layer 13 are formed on a substrate 11 sequentially, and then an oxide layer 14 is deposited on the polysilicon layer 13, as shown in FIG. 2(b), by means of a chemical vapor deposition (CVD) process. Subsequently, a photoresist layer 15 is formed and defined on the oxide layer 14 by means of a lithography process. Since the adhesion between the photoresist layer 15 and the CVD-deposited oxide layer 14 is poor (as shown in FIG. 2(c)), the photoresist layer 15 is easy to peel off during the follow-up BOE process, i.e. an isotropic wet etch process, as shown in FIG. 2(d). If the photoresist layer 15 peels off, the oxide layer 14 will be overetched and a trapezoid structure cannot be formed, as shown in FIG. 2(e). Moreover, in the follow-up dry etch process, the oxide layer 14 will be removed completely via a blanket etch, as shown in FIG. 2(f). Accordingly, a complete Schottky diode device cannot be obtained when the following ion implantation and formation of the metal layer 16 are performed on the above structure.

From the above, a wide and thick photoresist layer disposed on a narrow substrate often suffers the lifting issue in the BOE process, i.e. an isotropic wet etch process. Particularly, for the CVD film produced in an atmospheric or a sub-pressure process, it has low surface energy with photoresist, so the adhesion between the photoresist layer and the CVD film is poor. FIGS. 3(a)-3(b) show the SEM photographs of abnormal lifting photoresist according to the prior art. The photoresist layer 15 lifts, and even peels off, from the surface of the oxide layer 14 due to the low surface energy between the oxide layer 14 and the photoresist layer 15. Such poor adhesion will influence the following defining of the ion implanted region, and the etch direction and the residual thickness of the wet etch process, and even damage the electrical performance of the devices.

Therefore, there is a need to provide a method of manufacturing a Schottky diode device through adjusting the manufacturing process without increasing the cost.

BRIEF SUMMARY OF THE INVENTION

Embodiments of the present invention provide a method of manufacturing a Schottky diode device, in which a poly oxide layer is introduced to substitute the conventional CVD-deposited oxide for solving the problem of the poor adhesion between the oxide layer and the photoresist, thereby obtaining the Schottky diode device with a complete structure and a good electrical performance.

In accordance with an aspect of the present invention, the method of manufacturing an IC device includes: (a) providing a substrate; (b) forming a gate oxide layer on the substrate; (c) forming a polysilicon layer on the gate oxide layer; (d) partially oxidizing the polysilicon layer to form a poly oxide layer on the polysilicon layer; (e) forming and defining a photoresist layer on the poly oxide layer for exposing parts of the poly oxide layer; (f) executing a first etch via the photoresist layer to etch exposed parts of the poly oxide layer for forming a poly oxide structure; (g) executing a second etch via the photoresist layer to etch the polysilicon layer and the gate oxide layer for forming a polysilicon structure and a gate oxide structure; (h) removing the photoresist layer and executing an ion implantation process to form a first implanted region and a second implanted region in the substrate and the polysilicon structure respectively; and (i) forming a conducting structure on the first implanted region, the second implanted region and the poly oxide structure for obtaining the IC device.

In accordance with another aspect of the present invention, the method of manufacturing an IC device includes: (a) providing a substrate; (b) sequentially forming a gate oxide layer and a polysilicon layer on the substrate; (c) partially oxidizing the polysilicon layer to form a poly oxide layer on the polysilicon layer; (d) forming and defining a photoresist layer on the poly oxide layer for exposing parts of the poly oxide layer; (e) etching the poly oxide layer, the polysilicon layer and the gate oxide layer via the photoresist layer for forming a poly oxide structure, a polysilicon structure and a gate oxide structure; and (f) removing the photoresist layer.

DETAILED DESCRIPTION OF THE INVENTION

The embodiments described here are substantially used for explaining but not for limiting the present invention. The present invention is not limited to specific materials, procedures or sizes. The present invention is defined by the appended claims.

Figure 1A:
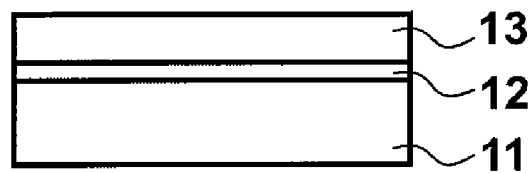
FIGS. 1(a)-1(h) illustrate a method of manufacturing a Schottky diode device according to prior art.
Figure 1B:
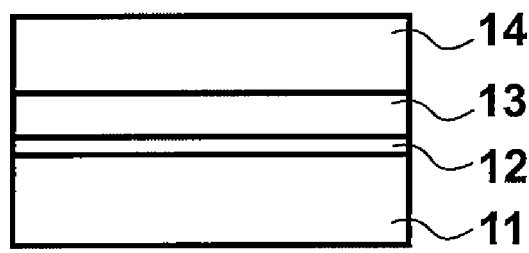
Figure 1C:
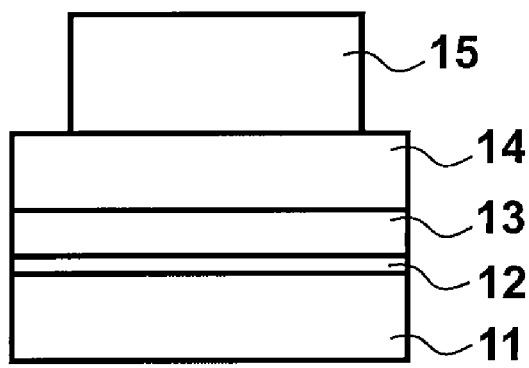
Figure 1D:
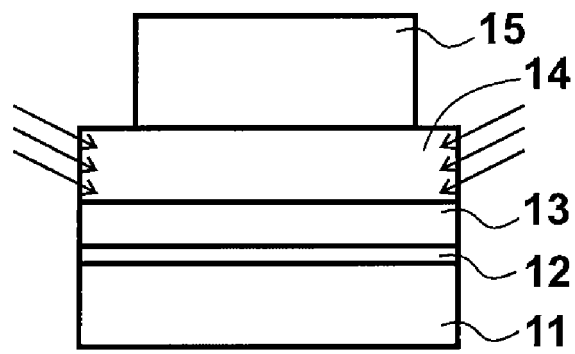
Figure 1E:
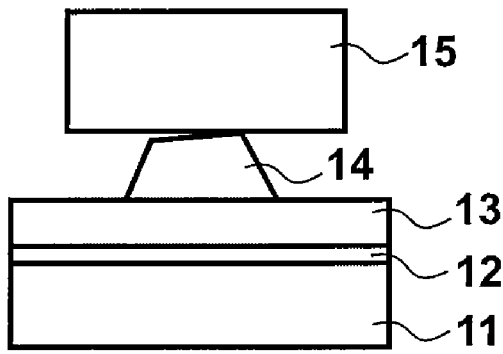
Figure 1F:
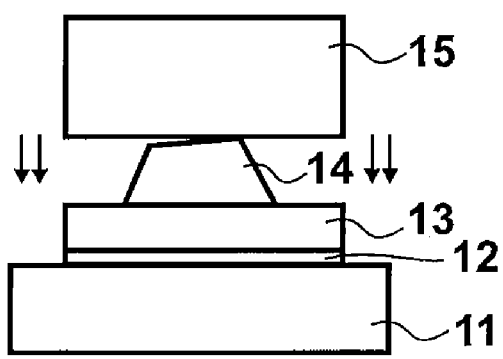
Figure 1G:
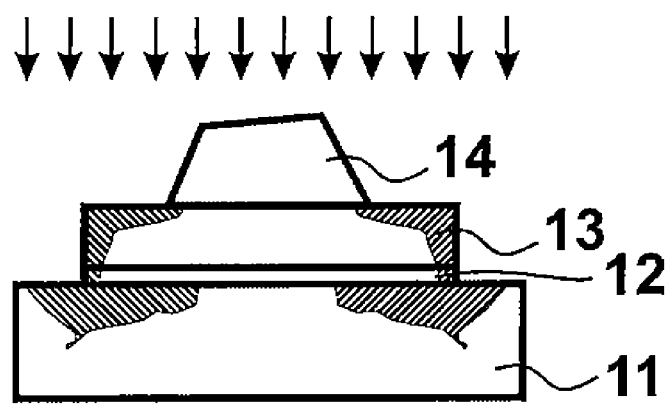
Figure 1H:
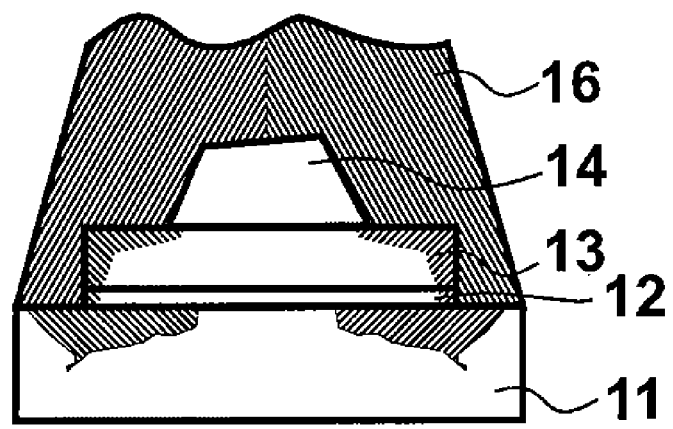
Figure 2A:
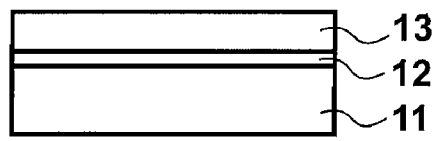
FIGS. 2(a)-2(h) illustrate a method of manufacturing a Schottky diode device according to prior art.
Figure 2B:
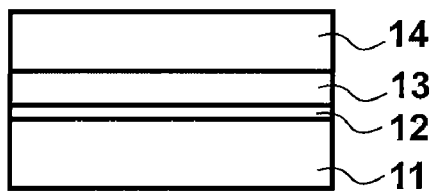
Figure 2C:
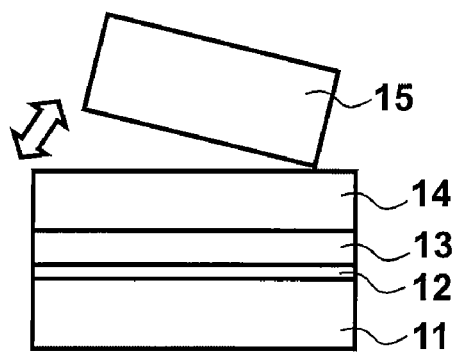
Figure 2D:
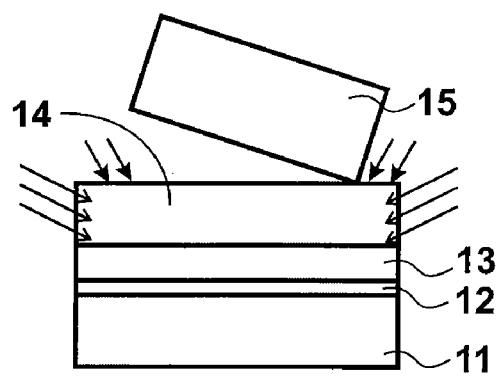
Figure 2E:
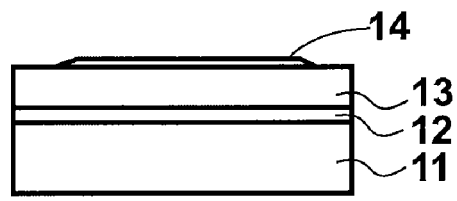
Figure 2F:
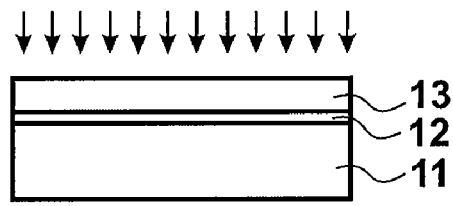
Figure 2G:
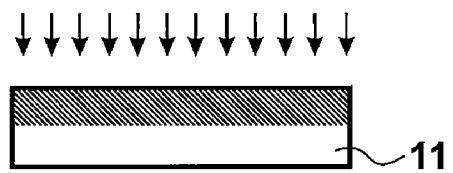
Figure 2H:
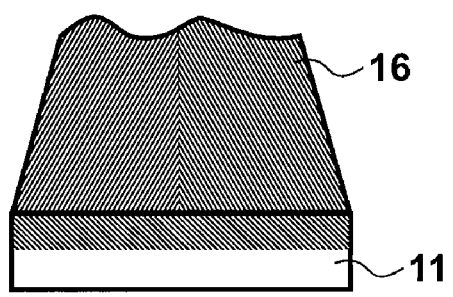
Figure 3A:
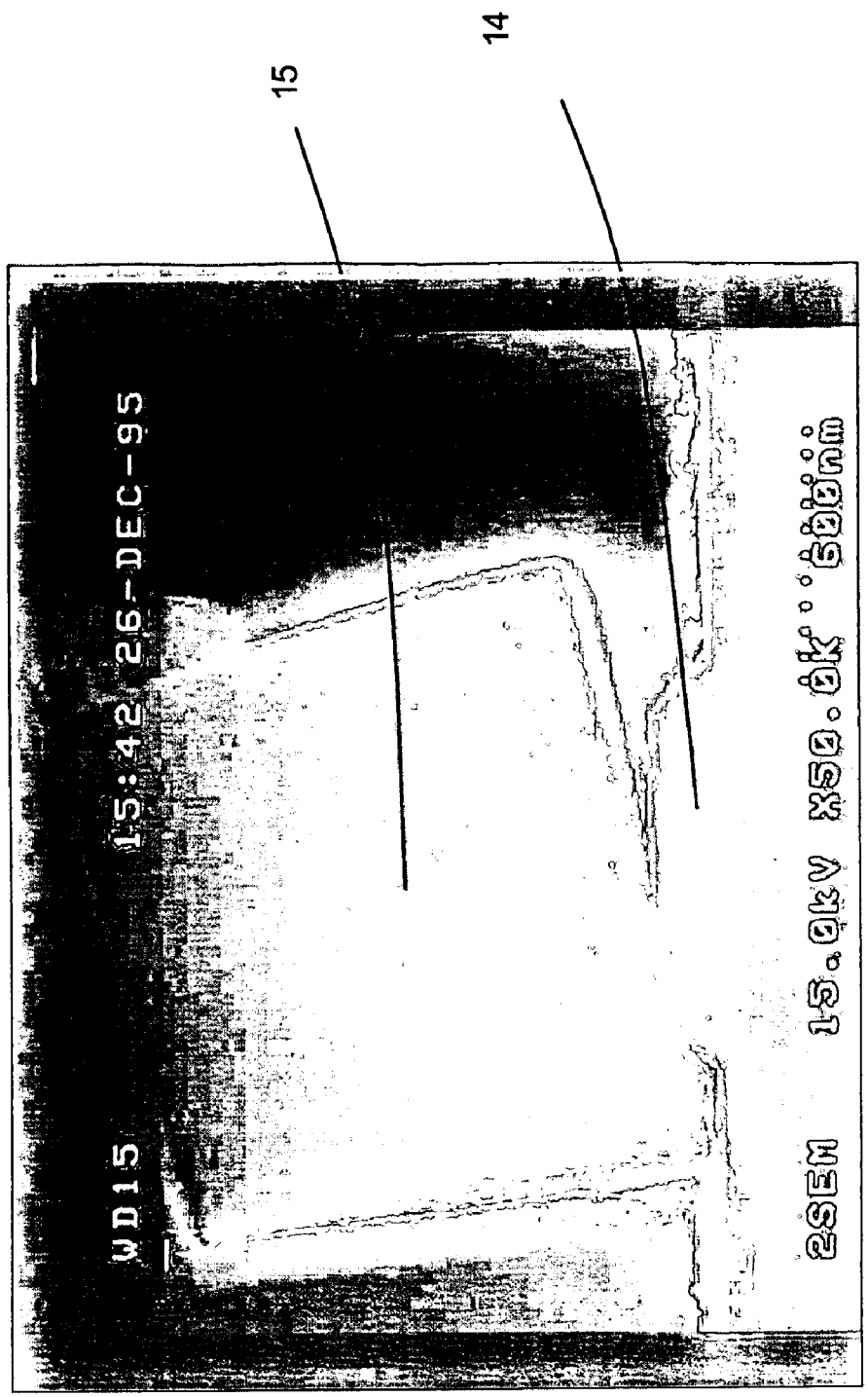
FIGS. 3(a)-3(b) show SEM photographs of abnormal lifting photoresist according to the prior art.
Figure 3B:
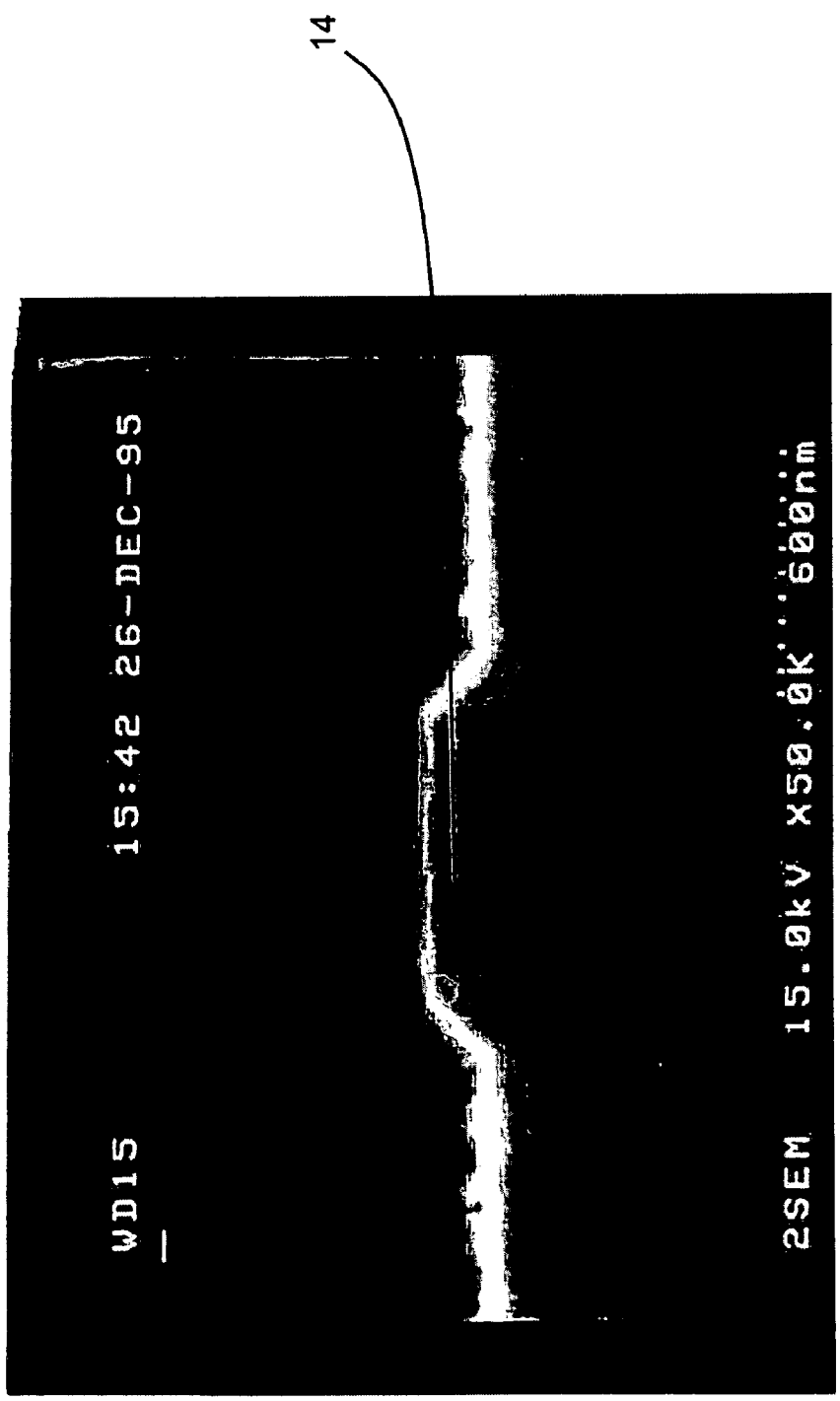
Figure 4A:
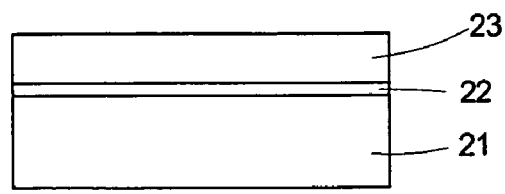
FIGS. 4(a)-4(h) illustrate a method of manufacturing a Schottky diode device according to one embodiment of the present invention.
Figure 4B:
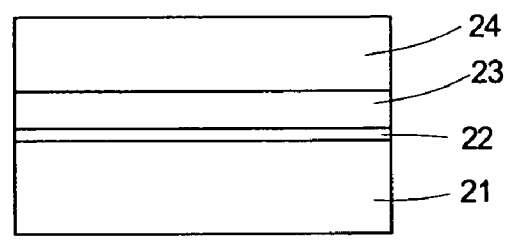
Figure 4C:
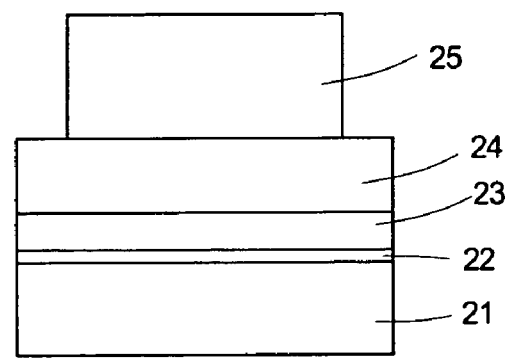
Figure 4D:
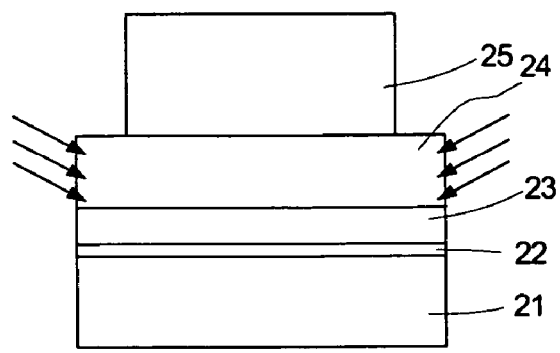
Figure 4E:
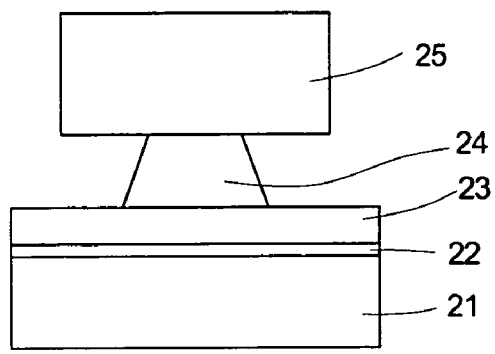
Figure 4F:
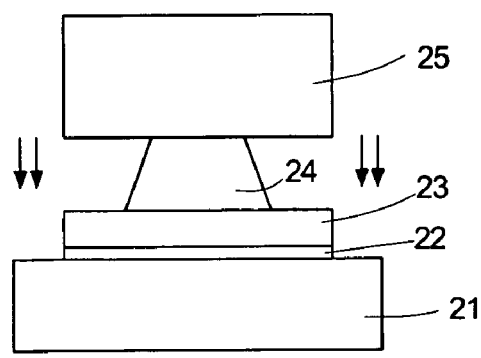
Figure 4G:
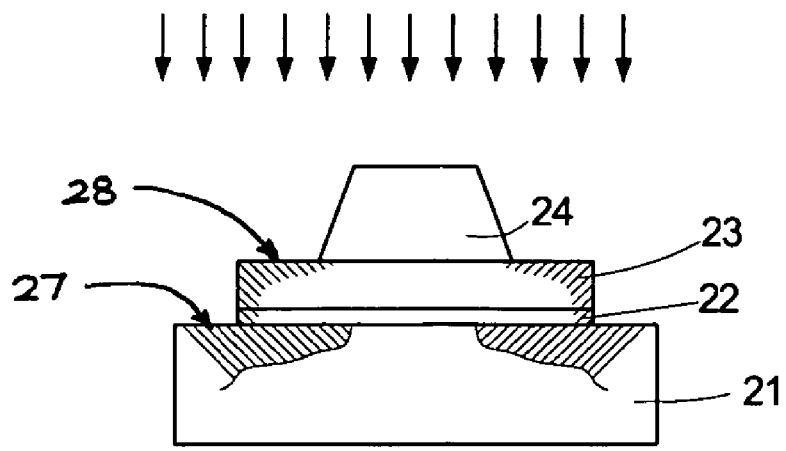
Figure 4H:
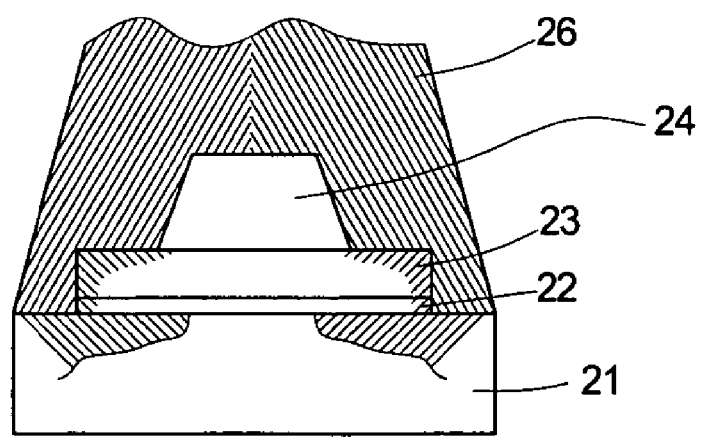

FIGS. 4(a)-4(h) illustrate a method of manufacturing a Schottky diode device according to an embodiment of the present invention. According to the method, first, a substrate 21 being a P-type or N-type silicon substrate is provided. Then, a gate oxide layer 22 is formed on the substrate 21 by thermal oxidizing the surface of the silicon substrate 21. In this embodiment, the substrate 21 is loaded into a thermal oxidation furnace at the temperature of about 850-950° C. and the pressure of about 760 torr, and about 2000 sccm oxygen is introduced thereinto to perform oxidation for 45 minutes. Then the gate oxide layer 22 having a thickness about 80 angstrom is formed. After the gate oxide layer 22 is formed, a polysilicon layer 23 is deposited on the gate oxide layer 22, as shown in FIG. 4(a), by means of an LPCVD process wherein the deposition process is performed at the temperature of about 560-600° C. and the pressure of about 0.5 torr, and with the introduction of SiH4 and PH3; the deposited polysilicon layer 23 has a thickness of about 1250 angstrom. Furthermore, the upper portion of polysilicon layer 23 is oxidized in a thermal oxidation furnace at the temperature of about 850-950° C. to form a poly oxide layer 24 having a thickness of about 1200 angstrom on the polysilicon layer 23, and the thickness of the polysilicon layer 23 is decreased by about two thirds (for example, about 800 angstrom). In one example, the thermal oxidation is performed under a mixed gas of 3300 sccm oxygen and 5500 sccm hydrogen at the pressure of 760 torr for about 17 minutes; the resulted structure is shown in FIG. 4(b). Subsequently, a photoresist layer 25 is coated on the poly oxide layer 24 and the desired pattern is defined thereon by means of a lithography process, as shown in FIG. 4(c). Then a first etch, an isotropic wet etch (i.e., BOE), is executed via the photoresist layer 25, as shown in FIG. 4(d), to etch the poly oxide layer 24 into a trapezoid structure, as shown in FIG. 4(e), wherein the photoresist layer 25 still adheres well to the trapezoid structure 24. After the first etch, a second etch, a dry etch, is further executed via the photoresist layer 25 to etch the polysilicon layer 23 and the gate oxide layer 22 for defining a MOS region of the device and forming the desired polysilicon structure 23 and gate oxide structure 22, as shown in FIG. 4(f). After removing the photoresist layer 25, an ion implantation process is performed, using the trapezoid structure of the poly oxide structure 24 as a mask, to form a first implanted region 27 and a second implanted region 28 in the substrate 21 and the polysilicon structure 23 respectively, as shown in FIG. 4(g). Finally, a metal conducting structure 26 is formed on the first implanted region 27, the second implanted region 28 and the poly oxide structure 24 for obtaining the Schottky diode device, as shown in FIG. 4(h).

Figure 5A:
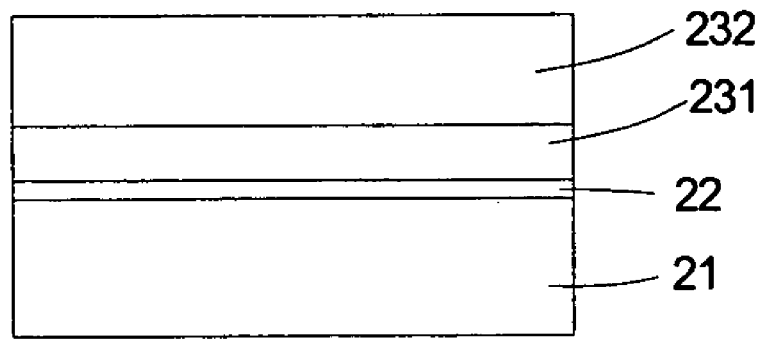
FIGS. 5(a)-5(b) illustrate multilayer structures of the polysilicon layer for manufacturing the Schottky diode devices according to an embodiment of the present invention.
Figure 5B:
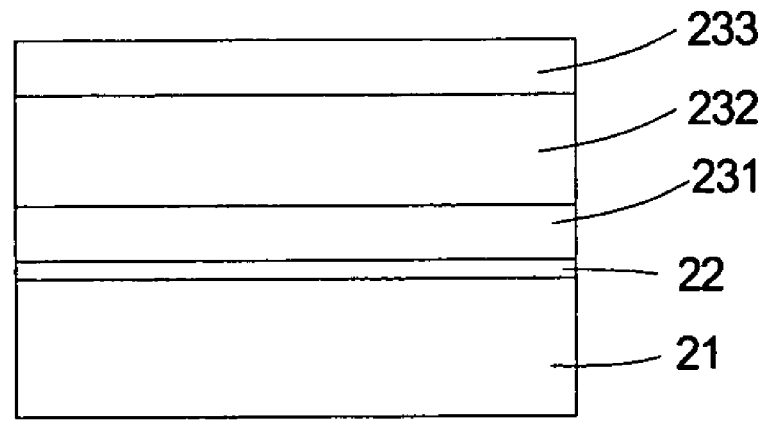
Figure 6:
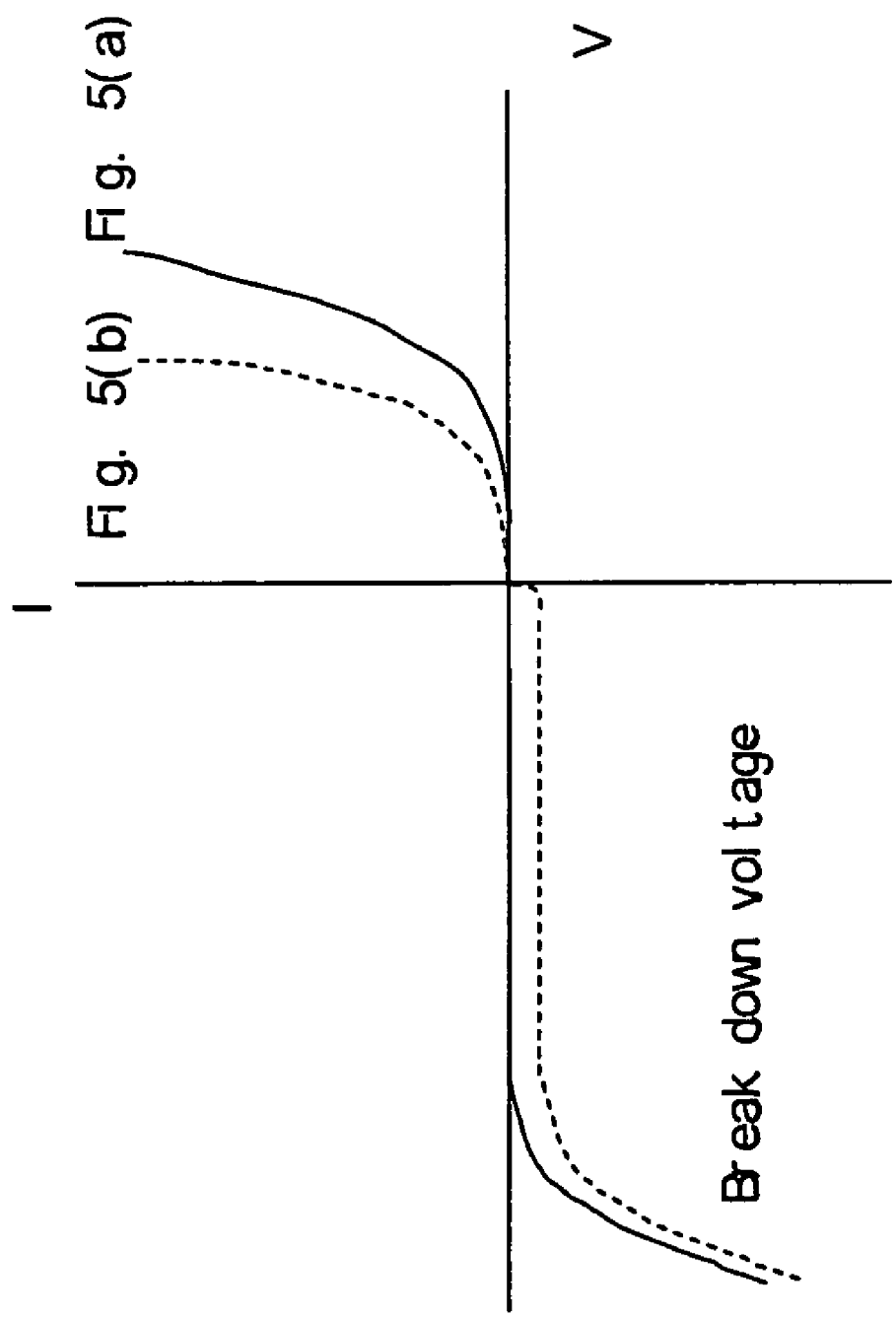
FIG. 6 shows the current-voltage (I-V) characteristic of the Schottky diode devices obtained from FIGS. 5(a) and 5(b)

According to an embodiment of the present invention, a method of manufacturing an IC device includes at least the steps of (a) providing a substrate 21; (b) sequentially forming a gate oxide layer 22 and a polysilicon layer 23 on the substrate 21, as shown in FIG. 4(a); (c) partially oxidizing the polysilicon layer 23 to form a poly oxide layer 24 on the polysilicon layer 23; (d) forming and defining a photoresist layer 25 on the poly oxide layer 24 for exposing parts of the poly oxide layer 24; (e) etching the poly oxide layer 24, the polysilicon layer 23 and the gate oxide layer 22 via the photoresist layer 25 for forming a poly oxide structure 24, a polysilicon structure 23 and a gate oxide structure 22, as shown in FIG. 4(f); and (f) removing the photoresist layer 25. In practice, the gate oxide layer 22, the polysilicon layer 23 and the poly oxide layer 24 can be formed according to the same processes as described above. Furthermore, when manufacturing a Schottky diode device, the deposited polysilicon layer 23 can include an undoped polysilicon layer 231 and a doped polysilicon layer 232 with a thicknesses ratio of 1:2, as shown in FIG. 5(a). Certainly, the polysilicon layer 23 can also include a first undoped polysilicon layer 231, a doped polysilicon layer 232 and a second undoped polysilicon layer 233 with a thicknesses ratio of 1:2:1, as shown in FIG. 5(b). Thus, the threshold voltage of the device can be adjusted. FIG. 6 shows the current-voltage (I-V) characteristic of the Schottky diode devices obtained from FIGS. 5(a) and 5(b). It is obvious that different polysilicon structures will cause the variance of the threshold voltages of devices.

Figure 7:
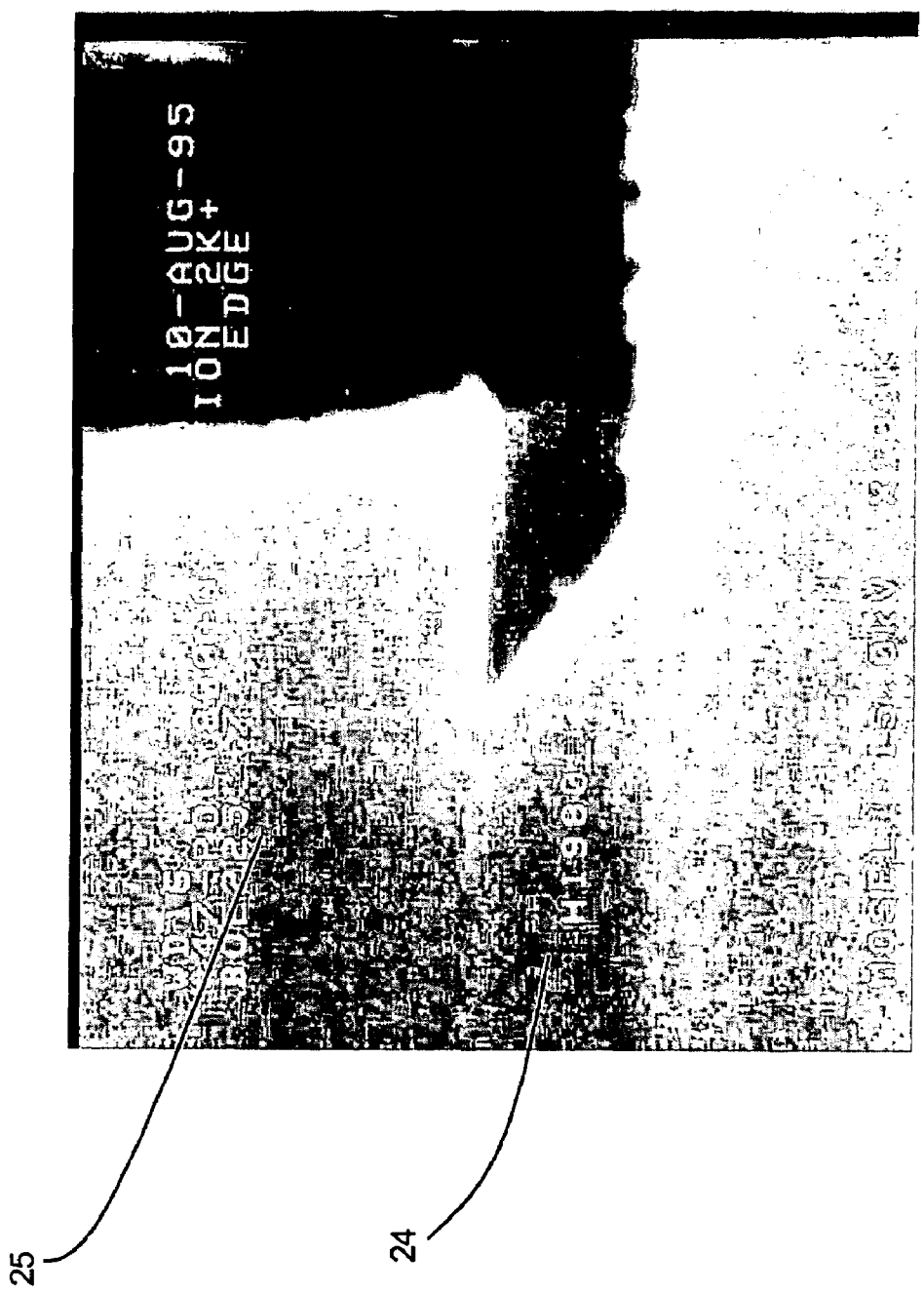
FIG. 7 shows an SEM photograph of the adhesion between the poly oxide layer and the photoresist according to an embodiment of the present invention.

The present invention introduces a poly oxide layer to replace the conventional deposited oxide layer for preventing the photoresist on the oxide layer from lifting and peeling off during the subsequent wet etch process due to poor adhesion therebetween. Compared with the conventional deposited oxide layer, the poly oxide layer of the present embodiment is obtained by oxidizing a polysilicon layer. As known, the deposited oxide layer has more impurities and the surface thereof is smoother, so the adhesion with the photoresist is poor. However, the surface of oxide layer obtained by means of oxidization is rougher than that of the deposited oxide layer. Hence, the present invention provides a higher surface energy between the poly oxide layer and the photoresist thereon, thereby achieving a better adhesion, as shown in FIG. 7, which shows an SEM photograph of the adhesion between the poly oxide layer 24 and the photoresist 25 according to the present invention. Accordingly, the present invention can effectively prevent the poor adhesion and lifting issue of the photoresist, which influences the subsequent defining of the ion implanted regions, and the etch direction and the residual thickness of the wet etch process.

Therefore, the present invention provides a method of manufacturing a Schottky diode device, which introduces a poly oxide layer to replace the conventional CVD-deposited oxide for solving the problem of the poor adhesion between the oxide layer and the photoresist, thereby obtaining the Schottky diode device with a complete structure and a good electrical performance.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of manufacturing an IC device, comprising:
providing a substrate;
forming a gate oxide layer on said substrate;
forming a polysilicon layer on said gate oxide layer;
partially oxidizing said polysilicon layer to form a poly oxide layer on said polysilicon layer;
forming and defining a photoresist layer on said poly oxide layer for exposing parts of said poly oxide layer;
executing a first etch via said photoresist layer to etch the exposed parts of said poly oxide layer for forming a poly oxide structure;
executing a second etch via said photoresist layer to etch said polysilicon layer and said gate oxide layer for forming a polysilicon structure and a gate oxide structure;
removing said photoresist layer and executing an ion implantation process to form a first implanted region in said substrate and a second implanted region in said polysilicon structure respectively; and
forming a conducting structure on said first implanted region, said second implanted region and said poly oxide structure for obtaining said IC device;
wherein said gate oxide layer is formed by a first thermal oxidation, said polysilicon layer is formed by an LPCVD process, and said polysilicon layer is partially oxidized by a second thermal oxidation, and
wherein said second thermal oxidation is performed under a mixed gas of oxygen and hydrogen in a ratio ranging from about 1:1 to about 3:5.

2. A method of manufacturing an IC device, comprising:
providing a substrate;
forming a gate oxide layer on said substrate;
forming a polysilicon layer on said gate oxide layer;
partially oxidizing said polysilicon layer to form a poly oxide layer on said polysilicon layer;
forming and defining a photoresist layer on said poly oxide layer for exposing parts of said poly oxide layer;
executing a first etch via said photoresist layer to etch the exposed parts of said poly oxide layer for forming a poly oxide structure;
executing a second etch via said photoresist layer to etch said polysilicon layer and said gate oxide layer for forming a polysilicon structure and a gate oxide structure;
removing said photoresist layer and executing an ion implantation process to form a first implanted region in said substrate and a second implanted region in said polysilicon structure respectively; and
forming a conducting structure on said first implanted region, said second implanted region and said poly oxide structure for obtaining said IC device;
wherein said polysilicon layer comprises an undoped polysilicon layer and a doped polysilicon layer with a thickness ratio ranging from about 1:2 to about 1:30.

3. A method of manufacturing an IC device, comprising:
providing a substrate;
forming a gate oxide layer on said substrate;
forming a polysilicon layer on said gate oxide layer;
partially oxidizing said polysilicon layer to form a poly oxide layer on said polysilicon layer;
forming and defining a photoresist layer on said poly oxide layer for exposing parts of said poly oxide layer;
executing a first etch via said photoresist layer to etch the exposed parts of said poly oxide layer for forming a poly oxide structure;
executing a second etch via said photoresist layer to etch said polysilicon layer and said gate oxide layer for forming a polysilicon structure and a gate oxide structure;
removing said photoresist layer and executing an ion implantation process to form a first implanted region in said substrate and a second implanted region in said polysilicon structure respectively; and
forming a conducting structure on said first implanted region, said second implanted region and said poly oxide structure for obtaining said IC device;
wherein said polysilicon layer comprises a first undoped polysilicon layer, a doped polysilicon layer and a second undoped polysilicon layer with a thickness ratio ranging from about 1:2:1 to about 1:30:1.

4. A method of manufacturing an IC device, comprising:
providing a substrate;
sequentially forming a gate oxide layer and a polysilicon layer on said substrate;
partially oxidizing said polysilicon layer to form a poly oxide layer on said polysilicon layer;
forming and defining a photoresist layer on said poly oxide layer for exposing parts of said poly oxide layer;
etching said poly oxide layer, said polysilicon layer and said gate oxide layer via said photoresist layer for forming a poly oxide structure, a polysilicon structure and a gate oxide structure; and
removing said photoresist layer;
wherein said polysilicon layer is partially oxidized by a second thermal oxidation, and
wherein said second thermal oxidation is performed under a mixed gas of oxygen and hydrogen in a ratio ranging from about 1:1 to about 3:5.

5. A method of manufacturing an IC device, comprising:
providing a substrate;
sequentially forming a gate oxide layer and a polysilicon layer on said substrate;
partially oxidizing said polysilicon layer to form a poly oxide layer on said polysilicon layer;
forming and defining a photoresist layer on said poly oxide layer for exposing parts of said poly oxide layer;
etching said poly oxide layer, said polysilicon layer and said gate oxide layer via said photoresist layer for forming a poly oxide structure, a polysilicon structure and a gate oxide structure; and
removing said photoresist layer;

wherein said polysilicon layer comprises an undoped polysilicon layer and a doped polysilicon layer with a thickness ratio ranging from about 1:2 to about 1:30.

6. A method of manufacturing an IC device, comprising:

providing a substrate;

sequentially forming a gate oxide layer and a polysilicon layer on said substrate;

partially oxidizing said polysilicon layer to form a poly oxide layer on said polysilicon layer;

forming and defining a photoresist layer on said poly oxide layer for exposing parts of said poly oxide layer;

etching said poly oxide layer, said polysilicon layer and said gate oxide layer via said photoresist layer for forming a poly oxide structure, a polysilicon structure and a gate oxide structure; and removing said photoresist layer;

wherein said polysilicon layer comprises a first undoped polysilicon layer, a doped polysilicon layer and a second undoped polysilicon layer with a thickness ratio ranging from about 1:2:1 to about 1:30:1.

* * * * *